(12) United States Patent
Koike et al.

(10) Patent No.: US 9,199,181 B2
(45) Date of Patent: Dec. 1, 2015

(54) CONTROLLING COMMUNICATION SYSTEM

(71) Applicant: Futaba Corporation, Mobara-shi, Chiba (JP)

(72) Inventors: Yasutaka Koike, Mobara (JP); Masahiro Saegusa, Mobara (JP); Masahiro Tanaka, Mobara (JP)

(73) Assignee: FUTABA CORPORATION, Mobara-Shi, Chiba (JP)

( * ) Notice: Subject to any disclaimer, the term of this patent is extended or adjusted under 35 U.S.C. 154(b) by 503 days.

(21) Appl. No.: 13/668,782

(22) Filed: Nov. 5, 2012

(65) Prior Publication Data

US 2013/0140914 A1 Jun. 6, 2013

(30) Foreign Application Priority Data

Dec. 6, 2011 (JP) ................. 2011-266475

(51) Int. Cl.
*A63H 30/04* (2006.01)
*G08C 17/02* (2006.01)
*G01R 31/36* (2006.01)
*G01R 19/165* (2006.01)

(52) U.S. Cl.
CPC ................ *A63H 30/04* (2013.01); *G08C 17/02* (2013.01); *G01R 19/16542* (2013.01); *G01R 31/362* (2013.01); *G01R 31/3689* (2013.01); *G08C 2201/12* (2013.01); *Y10T 307/858* (2015.04)

(58) Field of Classification Search
CPC ............... G08C 17/02; G08C 2201/12; G01R 19/16542; G01R 31/362; G01R 31/3689
USPC ........................................................ 307/140
See application file for complete search history.

(56) References Cited

U.S. PATENT DOCUMENTS

| 4,160,253 | A |   | 7/1979  | Mabuchi et al. |
|-----------|---|---|---------|----------------|
| 4,931,963 | A | * | 6/1990  | Kimura et al. ................ 702/184 |
| 5,428,252 | A |   | 6/1995  | Walker et al. |
| 2008/0285628 | A1 | * | 11/2008 | Gizis et al. ..................... 375/135 |
| 2009/0069956 | A1 | * | 3/2009  | Taya et al. ......................... 701/2 |

FOREIGN PATENT DOCUMENTS

| EP | 1701424 B1  | 6/2011  |
| JP | 61-239796   | 10/1986 |
| JP | 2011-078707 | 4/2011  |

OTHER PUBLICATIONS

The State Intellectual Property Office of the People's Republic of China, First Office Action, Application No. 201210517592.5, Aug. 22, 2014, 19 pages.

* cited by examiner

*Primary Examiner* — Rexford Barnie
*Assistant Examiner* — Toan Vu
(74) *Attorney, Agent, or Firm* — Quarles & Brady LLP

(57) ABSTRACT

There is provided a controlling communication system which includes a control device for transmitting a control signal, an object-side communication device mounted on a controlled object for receiving the control signal, and a drive control device for controlling the controlled object, and which can set a failsafe function of the object-side communication device using the control device, wherein a voltage reference value and a detection time reference value set by the control device are transmitted to the object-side communication device and are stored in a memory unit of the object-side communication device, and wherein the object-side communication device judges if the battery state meets a requirement for activating a failsafe function by referring to the voltage reference value and the detection time reference value stored in the memory unit.

8 Claims, 3 Drawing Sheets

CONTROLLING COMMUNICATION SYSTEM

This application is on the basis of Japanese Patent Application No. 2011-266475, the contents of which are hereby incorporated by reference.

TECHNICAL FIELD

The present invention relates to a controlling communication system including a control device arranged to transmit a control signal, an object-side communication device mounted on a controlled object such as a model or an industrial equipment and arranged to receive the control signal, and a drive control device arranged to perform drive control of the controlled object. More specifically, the present invention relates to the controlling communication system which notifies to an operator of a decrease in voltage of a power source used in the object-side communication device.

BACKGROUND ART

A radio control system (hereinafter called "the controlling communication system"), which remotely-controls a controlled object such as a model airplane, a model helicopter or a model automobile in a distant place using radio waves, is arranged to control the controlled object using a control device of an operator and is used in applications such as a hobby application, in which operators compete on the controlling skills such as speed or acrobatic performance, and in industrial equipment applications such as a grass cutter and a crane.

The control device of the controlling communication system is a device for controlling the controlled object and is provided with a transmission unit which transmits a control signal in accordance with the operation performed by an operator. The controlled object is mounted with an object-side communication device which includes a receiving unit for receiving the control signal and a drive control device such as a servo device or a gyroscopic device which maintains the stability of the controlled object, the drive control device being arranged to transmit a drive-control signal from the object-side communication device in accordance with the control signal to perform drive control of a power source such as an engine and a motor, an engine throttle lever and the respective components.

A variety of batteries such as a nickel cadmium battery, a nickel hydride battery and a lithium polymer battery may be used for a power-source battery in the object-side communication device. When the power-supply voltage of the object-side communication device falls below a predetermined value, then the normal communication with the control device may be lost and the controlled object may go out of control, causing runaway or crash of the controlled object.

For this reason, the controlling communication system is provided with a battery failsafe function which notifies to an operator of a decrease in the power-supply voltage of the object-side communication device via an operation of the controlled object. For example, when the power-supply voltage of the object-side communication device falls below a predetermined value, a drive-control signal is outputted to make the angular position of an output shaft of the servo device to be at the predetermined angular position. By doing so, for example if the controlled object is a model airplane, the model airplane circulates. In another example, when the battery failsafe function is applied to a servo device which controls an engine throttle lever, it is controlled to close the engine throttle and minimize the number of revolutions of the engine, for example.

After the battery failsafe function has been implemented, the operator can temporary cancel the battery failsafe function by performing a particular operation, e.g. fully opening the throttle using the control device, so the operator can control the controlled object for a certain period of time such as several tens of seconds. During this period of time the operator retrieves the controlled object. After the certain period of time, the battery failsafe function is implemented again. The operator may arbitrarily cancel the battery failsafe function and retrieve the controlled object before the controlled object becomes out of control due to further power consumption.

An example of a battery failsafe function is shown in Japanese Patent Application Publication No. S61-239796 which discloses a controlling communication system used in a hobby application including an object-side communication device 30 shown in FIG. 4. A control device (not shown) generates and transmits, separately from a control signal, a control signal S for battery failsafe function which controls an engine controlling servo device to stop the engine or to fix the number of revolutions of the engine to the minimum number.

The object-side communication device 30 amplifies and demodulates the signal received at a high-frequency circuit. A decoder 32 distributes the signals to a drive control device (not shown) such as a servo device. At this time, a control signal M for the engine controlling servo device is outputted to a switching circuit 33 together with the control signal S for battery failsafe function.

The switching circuit 33 normally outputs the control signal M; however, when the voltage of a power source 35 detected at a voltage detection circuit 34 falls below a reference voltage value, then the switching circuit 33 outputs to the engine controlling servo device the control signal S for battery failsafe function instead of the control signal M. The operator, once he has checked that the controlled object is being operated by the battery failsafe function, retrieves the controlled object or controls the servo device other than the engine controlling servo device by the control device to evacuate the controlled object to a safe place.

Furthermore, Japan Patent Application Publication No. 2011-78707 discloses a radio control receiver capable of setting a voltage reference value according to the situation and having a memory which stores the set reference voltage value, since the reference voltage value of the power source suitable for implementing the battery failsafe function varies depending on the type of battery and the usage environment.

Conventionally, in the battery failsafe function, the detection time used to determine that the battery voltage is decreased is fixed at about 200 milliseconds. This detection time takes into account the discharge property of the typically-used nickel cadmium battery as well as the time needed to retrieve the controlled object.

Meanwhile in recent years, the controlling communication system has been diversified. For example, introduction of multiple channels has increased the number of servo devices being operated at a time. Furthermore, there have been an increasing number of types of servo devices including a high-power servo device which requires a large amount of current consumption. In addition, various types of batteries having different internal resistance and discharge property are being used. Due to the change in the usage environment of the controlling communication system for the hobby application, the current consumption in the object-side communication device has increased, thus increasing the chance of an instant decrease in voltage of the power source.

In the case of using a high-power servo device in which a large amount of current is consumed by a battery with large inner resistance, depending on the usage environment of the controlling communication system, the conventional detection time for the battery failsafe function may cause the battery failsafe function to activate due to the detection of the instant decrease in voltage, even though there is still sufficient battery capacity left.

Thus, since an operator retrieves the controlled object based on the activation of the battery failsafe function, if the battery failsafe function is activated when there is sufficient battery capacity, the time allowed for the normal control of the controlled object is reduced. Furthermore, there is also a problem that, by charging the battery that has not been fully discharged, the battery life decreases.

SUMMARY OF INVENTION

In view of the above-described problems, the present invention provides, in a first aspect, an object-side communication device used in a controlling communication system, the controlling communication system including a control device arranged to transmit a control signal and a drive control device arranged to perform drive control of a controlled object, the object-side communication device being mounted on the controlled object and being arranged to receive the control signal, wherein the object-side communication device includes a voltage detection unit arranged to detect a power-supply voltage, an object-side receiving unit arranged to receive a signal containing a detection time reference value used for activation of a battery failsafe function, an object-side memory unit arranged to rewritably store the detection time reference value, and an object-side control unit arranged to compare the power-supply voltage with the voltage reference value and output to the drive control device a failsafe signal instead of the control signal if the power-supply voltage is lower than the voltage reference value continuously for a period of time equal to or longer than the detection time reference value.

In view of the above-described problems, the present invention provides, in a second aspect, the object-side communication device according to the first aspect, wherein the object-side receiving unit is arranged to receive a signal containing the voltage reference value to be compared with the power-supply voltage, and wherein the object-side memory unit is arranged to rewritably store the voltage reference value.

In view of the above-described problems, the present invention provides, in a third aspect, an object-side communication device used in a controlling communication system, the controlling communication system including a control device arranged to transmit a control signal and a drive control device arranged to perform drive control of a controlled object, the object-side communication device being mounted on the controlled object and being arranged to receive the control signal, wherein the object-side communication device includes a voltage detection unit arranged to detect a power-supply voltage, an object-side memory unit arranged to rewritably store the detection time reference value used for activation of a battery failsafe function, an object-side setting unit arranged to write the detection time reference value in the object-side memory unit, and an object-side control unit arranged to compare the power-supply voltage with the voltage reference value and output a failsafe signal instead of the control signal if the power-supply voltage is lower than the voltage reference value continuously for a period of time equal to or longer than the detection time reference value.

In view of the above-described problems, the present invention provides, in a forth aspect, the object-side communication device according to the third aspect, wherein the object-side memory unit is arranged to rewritably store the voltage reference value to be compared with the power-supply voltage, and wherein the object-side setting unit is arranged to write the voltage reference value in the object-side memory unit.

In view of the above-described problems, the present invention provides, in a fifth aspect, a control device used in a controlling communication system, the control device being arranged to transmit a control signal, the controlling communication system including a drive control device arranged to perform drive control of a controlled object and an object-side communication device mounted on the controlled object and arranged to receive the control signal, the object-side communication device including a memory unit arranged to rewritably store a reference value used for activation of a battery failsafe function, wherein the control device includes a control-side setting unit arranged to set a detection time reference value as the reference value used for activation of the battery failsafe function, and a control-side transmission unit arranged to transmit a signal containing the detection time reference value set by the control-side setting unit to the object-side communication device.

In view of the above-described problems, the present invention provides, in a sixth aspect, the control device according to the fifth aspect, wherein the control-side setting unit is arranged to set a voltage reference value as the reference value used for activation of the battery failsafe function, and wherein the control-side transmission unit is arranged to transmit a signal containing the voltage reference value set by the control-side setting unit to the object-side communication device.

In view of the above-described problems, the present invention provides, in a seventh aspect, a controlling communication system including a control device arranged to transmit a control signal, an object-side communication device mounted on a controlled object and arranged to receive the control signal, and a drive control device arranged to perform drive control of the controlled object, wherein the control device includes a control-side setting unit arranged to set a detection time reference value and a control-side transmission unit arranged to transmit a signal containing the detection time reference value to an object-side receiving unit of the object-side communication device, and the object-side communication device includes a voltage detection unit arranged to detect a power-supply voltage, an object-side memory unit arranged to rewritably store the detection time reference value contained in the signal transmitted from the control-side transmission unit, and an object-side control unit arranged to compare the power-supply voltage with the voltage reference value and output a failsafe signal instead of the control signal if the power-supply voltage is lower than the voltage reference value continuously for a period of time equal to or longer than the detection time reference value.

In view of the above-described problems, the present invention provides, in an eighth aspect, the controlling communication system according to the seventh aspect, wherein the control-side setting unit is arranged to set a voltage reference value to be compared with the power-supply voltage in the object-side communication device, the control-side transmission unit is arranged to transmit a signal containing the voltage reference value, and the object-side memory unit is arranged to store the voltage reference value contained in the signal transmitted from the control-side transmission unit.

Advantageous Effects of Invention

According to the object-side communication device of the first aspect, an operator can arbitrarily set the detection time for activation of the battery failsafe function in accordance with the usage environment of a battery in the object-side communication device. Thus, even when using the controlling communication system including a battery with large inner resistance and a high-power servo device, the battery failsafe function can be activated in a suitable manner. Furthermore, by changing the detection time, the battery failsafe function can be avoided from being activated excessively, so that the controlling communication can be used for a suitable amount of time until the capacity of the battery of the controlled object is low. Moreover, charging and discharging of the battery can be performed effectively, improving the lifetime of the battery.

According to the object-side communication device of the second aspect, since the voltage reference value can also be set arbitrarily by an operator, the battery failsafe function can be activated in even more suitable manner in accordance with the usage environment of the controlling communication system.

According to the object-side communication devices of the third and forth aspects, the detection time reference value and the voltage reference value can be set only by the object-side communication device using the object-side setting unit without the need to use the control device or a special device.

According to the control devices of the fifth and sixth aspects, the reference voltage and detection time can be set in the object-side communication device using the control device used in the controlling communication system without the need to use a special device.

According to the controlling communication systems of the seventh and eighth aspects, the detection time reference value and the voltage reference value can be set easily by the controlling device without the need to remove the object-side communication device mounted to the controlled object. Moreover, the detection time reference value and the voltage reference value can be set by the control device needed for the controlling of the controlled object without the need to use a special device.

DESCRIPTION OF EXEMPLARY EMBODIMENT

Figure 1:
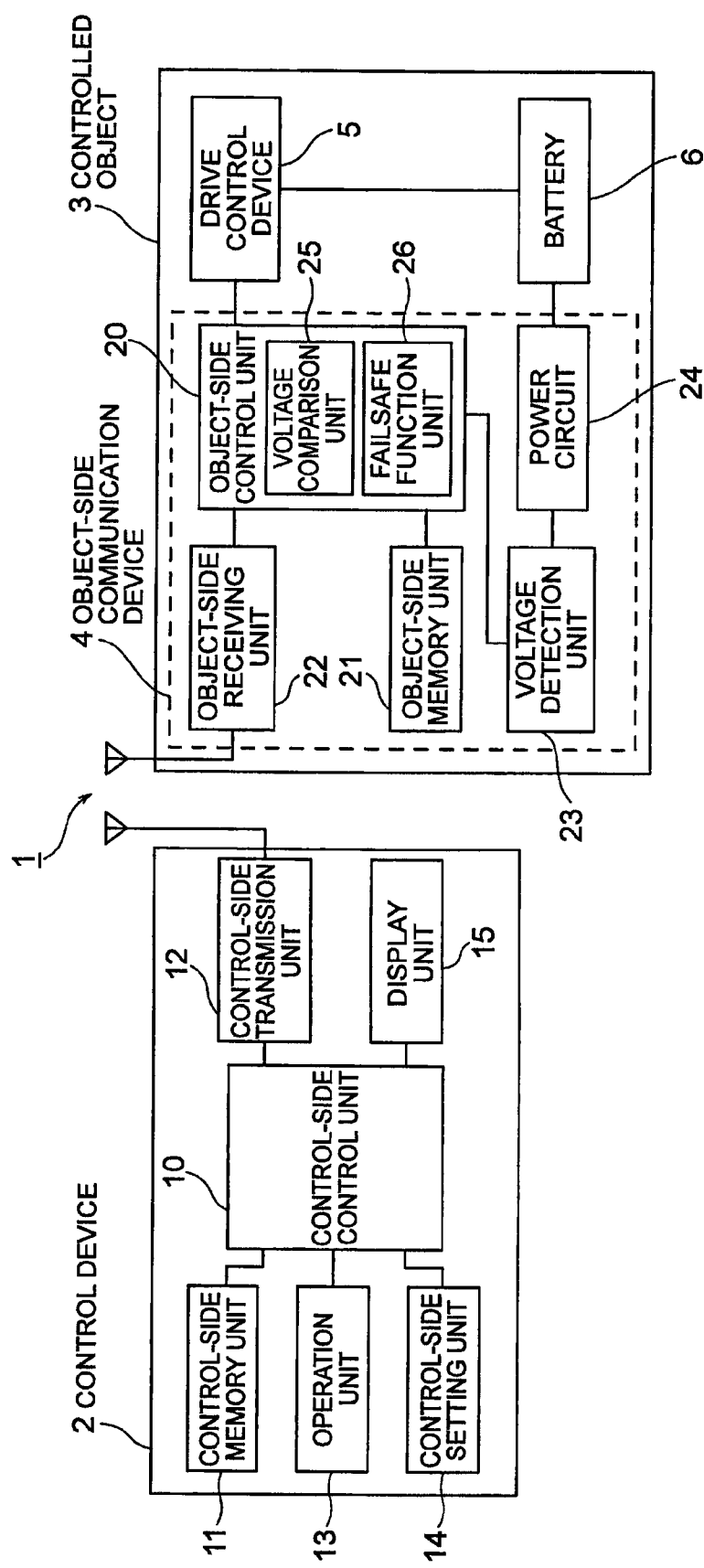
FIG. 1 is a block diagram of a controlling communication system according to one embodiment of the present invention.

In the following one exemplary embodiment of the present invention is explained in reference to FIG. 1 and FIG. 2. FIG. 1 is a block diagram showing a configuration example of a controlling communication system 1 according to one embodiment of the present invention. A control device 2 is a device for controlling a controlled object 3. The control device 2 may include a control-side control unit 10, a control-side memory unit 11, a control-side transmission unit 12, an operation unit 13, a control-side setting unit 14 and a display unit 15. The controlled object 3 may include an object-side communication device 4, a drive control device 5 and a battery 6. An operator operates the operation unit 13 to control the controlled object 3. The operation unit 13 includes a switch, a stick, a lever and such. The control-side setting unit 14 is arranged to configure the settings of devices mounted on the control device 2 and on the controlled object 3. The control-side setting unit 14 includes a switch, a stick, a lever, a touch panel and such.

The control-side control unit 10 is arranged to generate a control signal for driving the controlled object 3 in accordance with the operation of the operation unit 13. The control-side control unit 10 is also arranged to change the settings of the control device 2 in accordance with the setting contents set by the control-side setting unit 14. The control-side control unit 10 includes a CPU (Central Processing Unit) which performs the processing.

The display unit 15 is a device for displaying information of the controlled object 3 and various settings which have been changed according to the operation of the control-side setting unit 14. The control-side memory unit 11 is a memory which stores various settings of the control device 2.

The control-side transmission unit 12 is arranged to perform a transmission process for transmitting the control signal and a signal for a pairing process. In the pairing process, an identification sign of the control device 2 is stored in an object-side memory unit 21 of the object-side communication device 4 so that the object-side communication device 4 is allowed to communicate only with the control device 2 having the identification sign stored in the object-side memory unit 21.

The object-side communication device 4 is mounted on the controlled object 3 and is arranged to receive the control signal transmitted from the control device 2 and output a drive-control signal to the drive control device 5. In the drawing there is shown only one drive control device 5; however, if necessary it is possible to provide a plurality of devices for controlling the controlled object 3 including a servo device arranged to control a throttle lever of an engine (not shown), a servo device arranged to drive and control other components, and a gyroscopic device arranged to maintain the stability of the controlled object 3 if the controlled object 3 is a flying object.

The battery 6 is a power source which supplies power to the object-side communication device 4 via a power circuit 24. The battery 6 may be a nickel cadmium battery, a nickel hydride battery or a lithium polymer battery and such. Although not shown, the power circuit 24 supplies power to each component of the object-side communication device 4. A voltage detection unit 23 of the object-side communication device 4 is arranged to detect the voltage of the battery 6 via the power circuit 24 and output the battery measured voltage Vad to an object-side control unit 20 of the object-side communication device 4. The same battery may be used for the object-side communication device and the drive control device for downsizing and weight saving of the controlled object.

The object-side memory unit 21 is a memory arranged to store a reference voltage value Vth used in a voltage comparison unit 25 of the object-side control unit 20, a detection time reference value Cth used in a failsafe function unit 26, an identification sign of the paired control device 2 and various settings of the object-side communication device 4. Herein, the reference voltage value Vth is a voltage value to be compared with the battery measured voltage Vad. The detection time reference value Cth is a reference value indicative of a period of time during which the battery measured voltage Vad was lower than the reference voltage value Vth until the battery failsafe function is activated. An object-side receiving unit 22 of the object-side communication device 4 is arranged to perform a receiving process in which the control signal is received and outputted to the object-side control unit 20.

The object-side control unit 20 demodulates the control signal and outputs it to the drive control device 5. The object-side control unit 20 includes a voltage comparison unit 25 and a failsafe function unit 26. The voltage comparison unit 25 is arranged to compare the battery measured voltage Vad with the reference voltage value Vth read from the object-side memory unit 21. The failsafe function unit 26 is arranged to output a failsafe signal to the drive control device 5 when the battery measured voltage Vad is lower than the reference voltage value Vth continuously for a period of time equal to or longer than the detection time reference value Cth read from the object-side memory unit 21. The object-side control unit 20 performs the actual processing using a CPU.

The failsafe signal is a signal which may fix in advance the angular position of an output shaft of the servo device, i.e. the drive control device 5, to a predetermined angular position to perform the battery failsafe function. If the controlled object 3 is a model airplane, and when controlling the servo device which controls the drive of each component using the failsafe signal, the angular position of the output shaft of the servo device is fixed to a predetermined angular position to make the controlled object 3 to circulate. Furthermore, when controlling the servo device which controls the engine throttle using the failsafe signal, the servo device can be controlled so as to close the engine throttle and minimize the number of revolutions of the engine, for example.

Next, a method for setting the reference voltage value Vth and the detection time reference value Cth used for the battery failsafe in the object-side communication device 4 is explained. The control device 2 includes a control mode for controlling the controlled object 3 and a setting mode for changing the settings of the reference value used for the battery failsafe or other settings. Firstly, in the control device 2, the setting mode is selected, and the setting screen of the reference voltage value Vth and the detection time reference value Cth of the battery failsafe function are called up on the display unit 15. The setting screens for the reference voltage value Vth and the detection time reference value Cth may be prepared separately.

Then, the control-side setting unit 14 is controlled to set each of the reference voltage value Vth and the detection time reference value Cth. The reference voltage value Vth and the detection time reference value Cth may be set by selecting a suitable value from a plurality of predetermined fixed values, or by inputting an arbitral value by controlling the control-side setting unit 14. For example, the fixed values may be adapted to the types of batteries or the number of cells.

Then, at the time of pairing the control device 2 and the object-side communication device 4, the information of the reference voltage value Vth and the detection time reference value Cth for the battery failsafe function is included in the pairing signal (the signal used for the pairing) and transmitted from the control device 2 to the object-side communication device 4.

When registering the identification sign of the control device 2 in the object-side memory unit 21 in the pairing, the object-side communication device 4 also stores the reference voltage value Vth and the detection time reference value Cth in the object-side memory unit 21 as well. Furthermore, it is possible to set the default reference voltage value Vth and the default detection time reference value Cth in the object-side memory unit 21 in advance.

The pairing signal is transmitted and received using radio waves using the control-side transmission unit 12 and the object-side receiving unit 22. Alternatively, it is possible to provide a wired connection between the control device 2 and the object-side communication device 20 to transmit and receive the signal. Furthermore, only the reference voltage value Vth and the detection time reference value Cth may be transmitted and received separately from the pairing signal.

Furthermore, in the setting mode, a switch, a stick or a lever may be used for the control-side setting unit 14. These may be used for the operation unit 13 in the control mode. The control-side setting unit 14 may be a touch panel and the settings may be done by looking at a display of the touch panel. That is, the control-side setting unit 14 and the display unit 15 may be provided as one unit.

Figure 2:
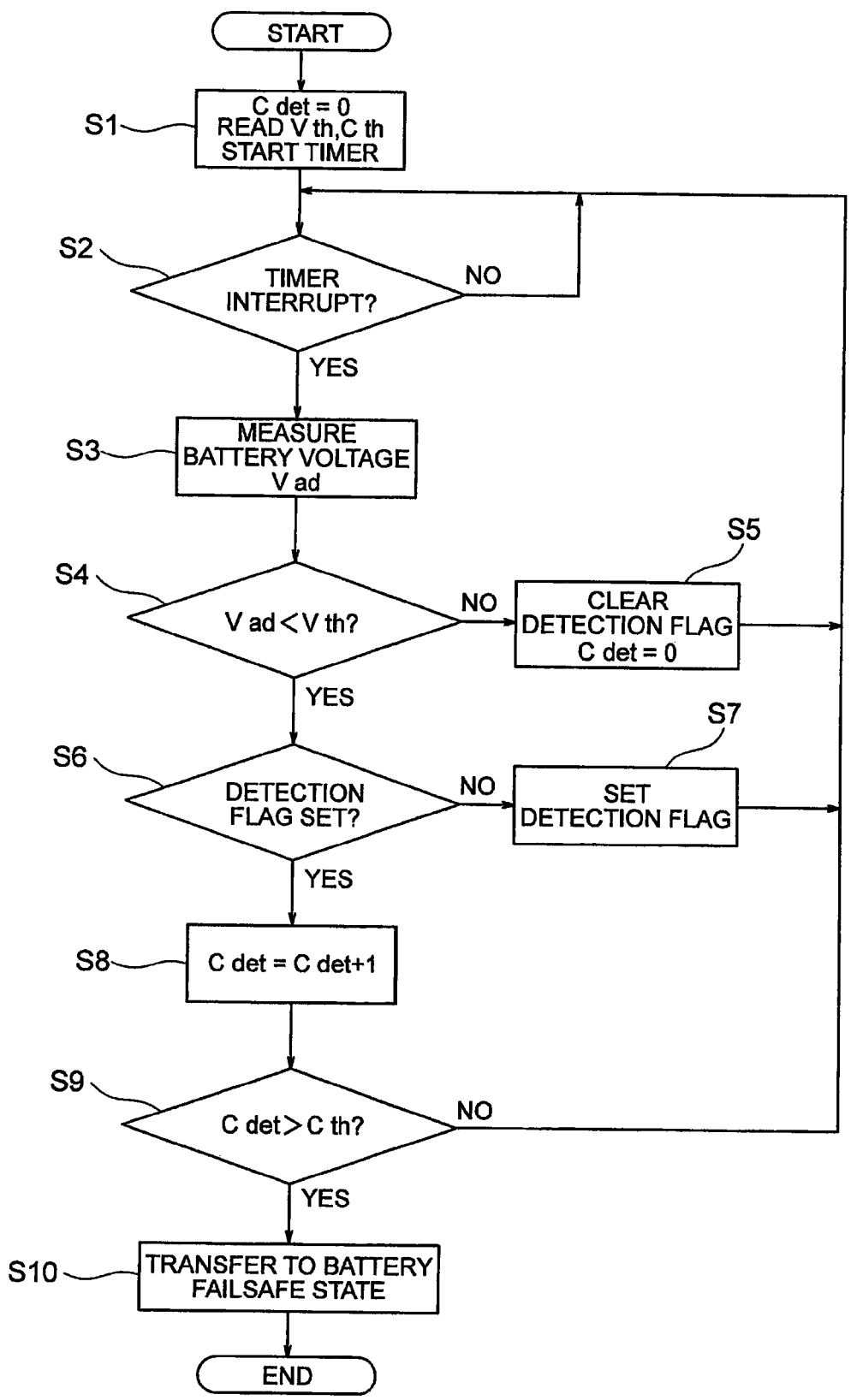
FIG. 2 is a flow chart showing a flow of processing for activating a battery failsafe function.

Next, the flow of the activation of the battery failsafe function is explained in reference to FIG. 2. This process is performed in the object-side control unit 20. In FIG. 2, Cdet indicates a detection counter value, and the detection counter is a counter provided to the object-side control unit 20.

Firstly, the detection counter value Cdet is set to zero, and the voltage reference value Vth and the detection time reference value Cth are read from the object-side memory unit 21 into the object-side control unit 20, and a timer is started (S1). The timer is provided to the object-side control unit 20 and is arranged to perform an interruption at a predetermined period (e.g. several tens of milliseconds) (S2, YES). Once the interruption by the timer occurs, the voltage of the battery 6 as a power source is measured by the voltage detection unit 25 via the power circuit 24 (S3).

Then, the battery measured voltage Vad which is a voltage measurement of the battery 6 is compared with the voltage reference value Vth at the voltage comparison unit 25 (S4). If the comparison result shows that the battery measure voltage Vad is higher than the voltage reference value Vth (S4, NO), then the detection flag of the object-side control unit 20 is cleared and the detection counter is set to zero (S5), and the timer is started again. If the voltage reference value Vth is higher than the battery measured voltage Vad (S4, YES), then it is judged if the detection flag is set in the object-side control unit 20 (S6). If the detection flag is currently not set (S6, NO), then the detection flag is set (S7), and the timer is started again.

If the detection flag is currently set (S6, YES), then 1 is added to the detection counter value Cdet (S8). After that, the detection time reference value Cth and the detection counter value Cdet are compared (S9). If the detection time reference value Cth is greater than the detection counter value Cdet (S9, NO), the detection counter value Cdet remains the same and the timer is started again. If the detection counter value Cdet is greater than the detection time reference value Cth (S9, YES), a state transfers into the battery failsafe state, and the battery failsafe function is activated (S10) and the process ends.

Figure 3:
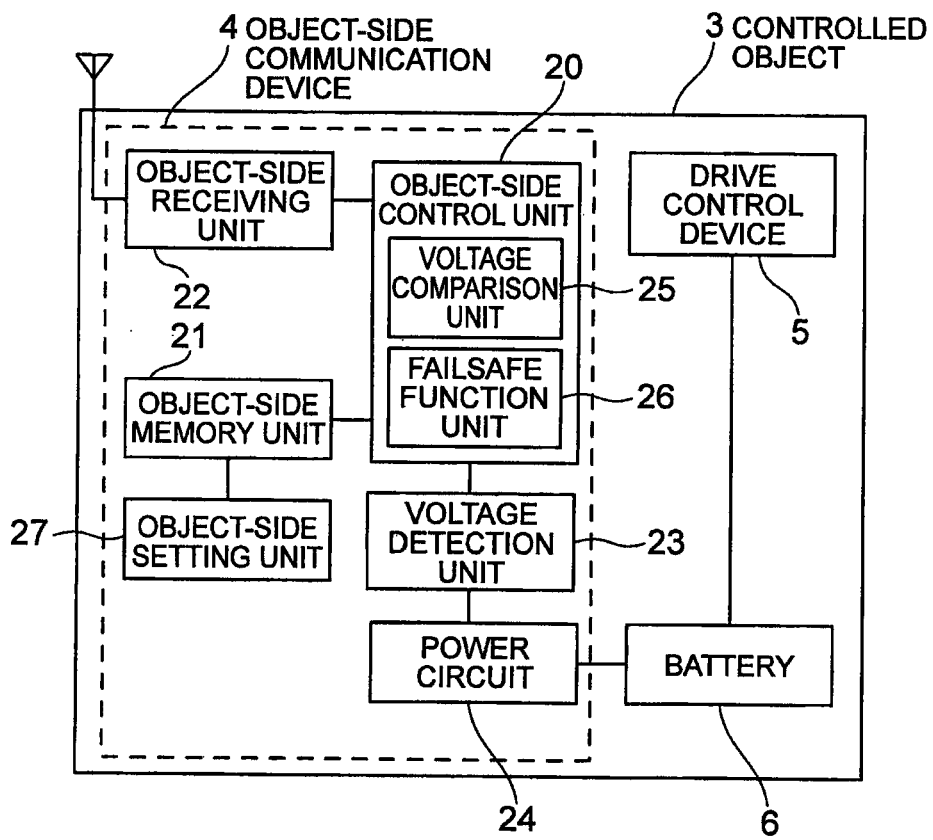
FIG. 3 is a block diagram of an object-side communication device according to another embodiment of the present invention.
Figure 4:
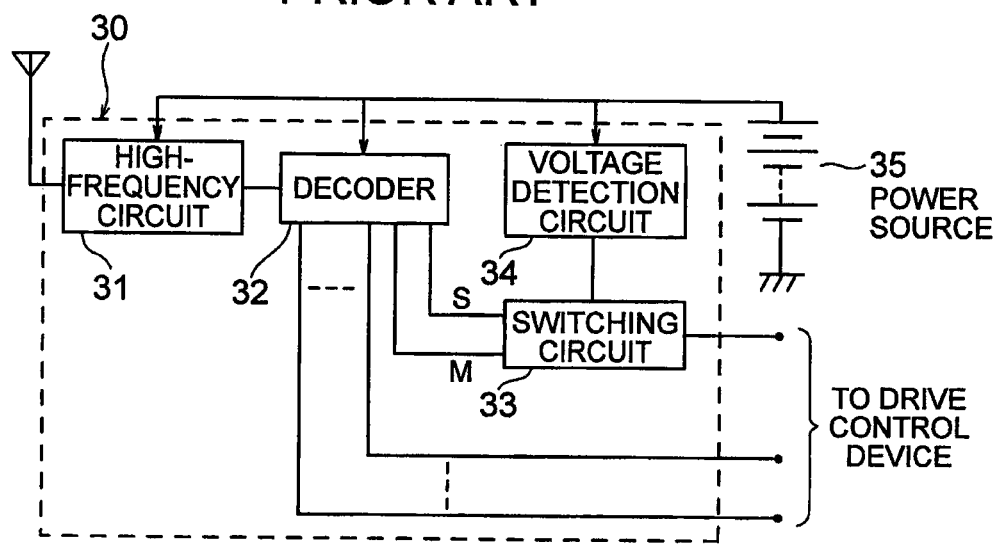
FIG. 4 is a block diagram of a conventional object-side communication device.

According to an another embodiment of the present invention shown in FIG. 3, an object-side communication device 4' may be provided with an object-side setting unit 27, so that the voltage reference value Vth and the detection time reference value Cth can be set directly in the object-side memory unit 21. In FIG. 3, like elements are indicated by the same reference signs as FIG. 1.

According to a yet another embodiment of the present invention, the voltage reference value Vth and the detection time reference value Cth may be set in the object-side communication device using an external device such as a personal computer or a dedicated setting device. In such embodiment, the object-side communication device and the external device may be in communication connection with respect to each other, or may be in a wired connection using a cable or the like.

In addition, according to an another embodiment, there may be provided with a transmission unit and a receiving unit for communication of the voltage reference value Vth and the detection time reference value Cth in a manner separately from the control-side transmission unit and the object-side receiving unit for transmitting and receiving the control signal.

As explained above, the controlling communication system 1 described above is arranged to activate the battery failsafe function when the battery measured voltage Vad is lower than the voltage reference value Vth continuously for a predetermined period of time, i.e. the detection time reference value Cth.

According to the present invention, the voltage reference value Vth and the detection time reference value Cth can be arbitrarily set by an operator, thus the conditions for activating the battery failsafe function can be changed in accordance with the type of battery 6 and the usage environment. By changing the detection time from 200 milliseconds which is used conventionally to about one second, the activation of the battery failsafe function due to the instant decrease in voltage can be prevented. Consequently, the battery capacity can be fully used, thus the time for controlling the controlled object 3 can be increased and the life of the battery 6 can be improved.

The exemplary embodiments described herein are only representative embodiments of the present invention and are not intended to limit the present invention. That is, the shown embodiments can be modified or changed in various ways without departing from the spirit and scope of the present invention.

REFERENCE SIGNS LIST 1 controlling communication system
2 control device
3 controlled object
4 object-side communication device
6 battery
20 object-side control unit
21 object-side memory unit
23 voltage detection unit
25 voltage comparison unit
26 failsafe function unit

The invention claimed is:

1. An object-side communication device (4) used in a controlling communication system (1), the controlling communication system (1) including a control device (2) arranged to transmit a control signal and a drive control device (5) arranged to perform drive control of a controlled object (3), the object-side communication device (4) being mounted on the controlled object (3) and being arranged to receive the control signal,
characterized in that the object-side communication device (4) comprises
a voltage detection unit (23) arranged to detect a power-supply voltage,
an object-side receiving unit (22) arranged to receive a signal containing a detection time reference value used for activation of a battery failsafe function,
an object-side memory unit (21) arranged to rewritably store the detection time reference value, and
an object-side control unit (20) arranged to compare the power-supply voltage with a voltage reference value and output to the drive control device (5) a failsafe signal instead of the control signal if the power-supply voltage is lower than the voltage reference value continuously for a period of time equal to or longer than the detection time reference value.

2. The object-side communication device (4) according to claim 1, wherein the object-side receiving unit (22) is arranged to receive a signal containing the voltage reference value to be compared with the power-supply voltage, and wherein the object-side memory unit (21) is arranged to rewritably store the voltage reference value.

3. An object-side communication device (4') used in a controlling communication system (1), the controlling communication system (1) including a control device (2) arranged to transmit a control signal and a drive control device (5) arranged to perform drive control of a controlled object (3), the object-side communication device (4') being mounted on the controlled object (3) and being arranged to receive the control signal,
characterized in that the object-side communication device (4') comprises
a voltage detection unit (23) arranged to detect a power-supply voltage,
an object-side memory unit (21) arranged to rewritably store a detection time reference value used for activation of a battery failsafe function,
an object-side setting unit (27) arranged to write the detection time reference value in the object-side memory unit (21), and
an object-side control unit (20) arranged to compare the power-supply voltage with the voltage reference value and output a failsafe signal instead of the control signal if the power-supply voltage is lower than the voltage reference value continuously for a period of time equal to or longer than the detection time reference value.

4. The object-side communication device (4') according to claim 3, wherein the object-side memory unit (21) is arranged to rewritably store the voltage reference value to be compared with the power-supply voltage, and wherein the object-side setting unit (27) is arranged to write the voltage reference value in the object-side memory unit (21).

5. A control device (2) used in a controlling communication system (1), the control device (2) being arranged to transmit a control signal, the controlling communication system (1) including a drive control device (5) arranged to perform drive control of a controlled object (3) and an object-side communication device (4) mounted on the controlled object (3) and arranged to receive the control signal, the object-side communication device (4) including a memory unit (21) arranged to rewritably store a reference value used for activation of a battery failsafe function,
characterized in that the control device (2) comprises
a control-side setting unit (14) arranged to set a detection time reference value as the reference value used for activation of the battery failsafe function, and
a control-side transmission unit (12) arranged to transmit a signal containing the detection time reference value set by the control-side setting unit (14) to the object-side communication device (4).

6. The control device (2) according to claim 5, wherein the control-side setting unit (14) is arranged to set a voltage reference value as the reference value used for activation of the battery failsafe function, and wherein the control-side transmission unit (12) is arranged to transmit a signal containing the voltage reference value set by the control-side setting unit (14) to the object-side communication device (4).

7. A controlling communication system (1) comprising a control device (2) arranged to transmit a control signal, an object-side communication device (4) mounted on a controlled object (3) and arranged to receive the control signal, and a drive control device (5) arranged to perform drive control of the controlled object (3), characterized in that the control device (2) includes a control-side setting unit (14) arranged to set a detection time reference value and a control-side transmission unit (12) arranged to transmit a signal containing the detection time reference value to an object-side receiving unit (22) of the object-side communication device (4), and the object-side communication device (4) includes a voltage detection unit (23) arranged to detect a power-supply voltage, an object-side memory unit (21) arranged to rewritably store the detection time reference value contained in the signal transmitted from the control-side transmission unit (12), and an object-side control unit (20) arranged to compare the power-supply voltage with a voltage reference value and output a failsafe signal instead of the control signal if the power-supply voltage is lower than the voltage reference value continuously for a period of time equal to or longer than the detection time reference value.

8. The controlling communication system (1) according to claim 7, wherein the control-side setting unit (14) is arranged to set the voltage reference value to be compared with the power-supply voltage in the object-side communication device (4), the control-side transmission unit (12) is arranged to transmit a signal containing the voltage reference value, and the object-side memory unit (21) is arranged to store the voltage reference value contained in the signal transmitted from the control-side transmission unit (12).

* * * * *